United States Patent [19]
Parker

[11] Patent Number: 5,349,700
[45] Date of Patent: Sep. 20, 1994

[54] ANTENNA TUNING SYSTEM FOR OPERATION OVER A PREDETERMINED FREQUENCY RANGE

[75] Inventor: Robert P. Parker, Westboro, Mass.

[73] Assignee: Bose Corporation, Framingham, Mass.

[21] Appl. No.: 783,273

[22] Filed: Oct. 28, 1991

[51] Int. Cl.$^5$ .............................................. H04B 1/16
[52] U.S. Cl. ............................ 455/193.2; 455/192.2; 455/197.2; 455/272
[58] Field of Search ............... 455/193.1, 193.2, 193.3, 455/197.1–197.3, 196.1, 138, 139, 272, 281, 289, 290, 182.1–184.1, 192.1–192.3

[56] References Cited

U.S. PATENT DOCUMENTS

| | | | |
|---|---|---|---|
| 3,473,128 | 10/1969 | Kiser | 455/193.1 |
| 3,869,674 | 3/1975 | Borbely | 455/192.2 |
| 4,100,578 | 7/1978 | Arneson | 455/192.3 |
| 4,843,636 | 6/1989 | Hendriks et al. | 455/182.2 |
| 4,996,599 | 2/1991 | Anderson | 455/197.2 |
| 5,077,834 | 12/1991 | Andros et al. | 455/193.1 |

Primary Examiner—Reinhard J. Eisenzopf
Assistant Examiner—Chi Pham
Attorney, Agent, or Firm—Fish & Richardson

[57] ABSTRACT

A tunable antenna system operates over a predetermined frequency range with an antenna having a length and width each significantly less than a quarter wavelength within the predetermined frequency range. A controllable reactive element is coupled to the antenna and has a variable reactance for tuning the antenna in a resonant circuit to the frequency of a desired signal in the predetermined frequency range. An antenna-tuning circuit is responsive to the frequency to which the antenna is tuned for providing an antenna-tuning signal to the controllable reactive element to control the reactance of the controllable reactive element so that the antenna remains tuned to the desired signal. The antenna tuning signal includes a dither component of dither frequency for varying the tuning of the antenna around the desired signal. The antenna tuning circuit includes a level detector for providing a level signal representative of a signal transduced by the antenna. The level signal includes a second harmonic component of frequency twice the dither frequency. A second harmonic detector responds to the second harmonic component to provide a dither amplitude control signal that reduces the amplitude of the dither signal with increasing amplitude of the second harmonic component.

21 Claims, 5 Drawing Sheets

ANTENNA TUNING SYSTEM FOR OPERATION OVER A PREDETERMINED FREQUENCY RANGE

This invention relates to improving antennas.

Antennas typically have dimensions comparable to a multiple of one quarter of the wavelength of the radiated energy. It is often impractical to realize these dimensions with physical structures, where, for example, the wavelength is relatively long, as in the AM radio band. One typical technique is to approach these dimensions by adding electrical length with inductive loading of an antenna of relatively long mechanical length.

Veranth (U.S. application Ser. No. 07/540,108, also assigned to the assignee of this application, the disclosure of which is incorporated herein by reference discloses a tunable antenna system operating over a predetermined frequency range which includes a high-Q antenna having a length and width significantly less than a quarter wavelength at the desired frequency of operation. A controllable reactive element having a variable reactance is coupled to the antenna for tuning the antenna in a high-Q resonant circuit to the desired signal frequency. An antenna tuning circuit responsive to the frequency to which the antenna is tuned provides an antenna tuning signal to the controllable reactive element so that the antenna remains tuned to the frequency of the desired signal. The antenna tuning signal is dithered by a fixed amplitude 16 Hz sinusoid to allow the system to capture the desired signal.

A tunable antenna system for operation over a predetermined frequency range includes an antenna having a length and a width each significantly less than a quarter wavelength within the predetermined frequency range. A controllable reactive element is coupled to the antenna having a variable reactance for tuning the antenna in a resonant circuit to the frequency of a desired signal in the frequency range. An antenna-tuning circuit responsive to the frequency to which the antenna is tuned provides an antenna-tuning signal to the controllable reactive element to control the reactance of the reactive element so that the antenna remains tuned to the frequency of the desired signal. The antenna-tuning signal includes at least two and preferably three of a frequency approximation component for roughly tuning the antenna to the frequency of the desired signal, an error component for fine tuning the antenna to the frequency of the desired signal, and a dither component for varying the tuning of the antenna around the frequency of the desired signal. The antenna-tuning circuit may include a detector for producing a level signal representative of a signal transduced by the antenna, a generator for producing a low frequency dither signal, a tracking error correction circuit for producing the error component of the antenna-tuning signal in response to the amount of energy present in the level signal of dither frequency and a second-harmonic detector for producing the dither component of the antenna-tuning signal in response to the amount of energy of twice the dither frequency present in the level signal. The tracking error correction circuit may include a multiplier for multiplying the level signal with the dither signal to produce a product signal having a D.C. level, and an integrator for integrating the D.C. level of the product signal to produce the error component of the antenna-tuning signal. The detector may be an envelope detector for producing the level signal representative of the envelope of a carrier signal transduced by the antenna. The generator may further provide a reference signal of twice the dither frequency, and the second harmonic detector may comprise a first multiplier for multiplying the level signal with the reference signal to produce a product signal having a D.C. level, an integrator for integrating the D.C. level of that product signal to produce an integrated product signal, and a second multiplier for multiplying the integrated product signal with the dither signal to produce the dither component of the antenna-tuning signal. There may be a superheterodyne receiver circuit having a local oscillator of controllable frequency, a frequency synthesizer for controlling the controllable frequency, and a tracking approximation circuit for producing the frequency approximation component of the tuning signal responsive to the frequency synthesizer. The controllable reactive element may be a varactor. The system preferably includes a tuner for tuning the antenna-using system over a frequency range substantially greater than the bandwidth of a desired signal transduced by the antenna. Preferably, the antenna and reactive element comprise a resonant circuit having a Q greater than 100.

According to another aspect of the invention, there are first and second ones of said antennas in a diversity system comprising first and second like channels, each channel including a product detector for detecting the modulation on received signals at dither frequency with the latter product detectors energized by reference signals of dither frequency in phase quadrature. Preferably, these channels also include respective second harmonic product detectors for detecting modulation components in the received signals at twice the dither frequency with each of the latter detectors energized by respective reference signals of twice dither frequency in phase opposition.

Numerous other features, objects and advantages of the invention will become apparent from the following detailed description when read in connection with the accompanying drawing in which.

Figure 1:
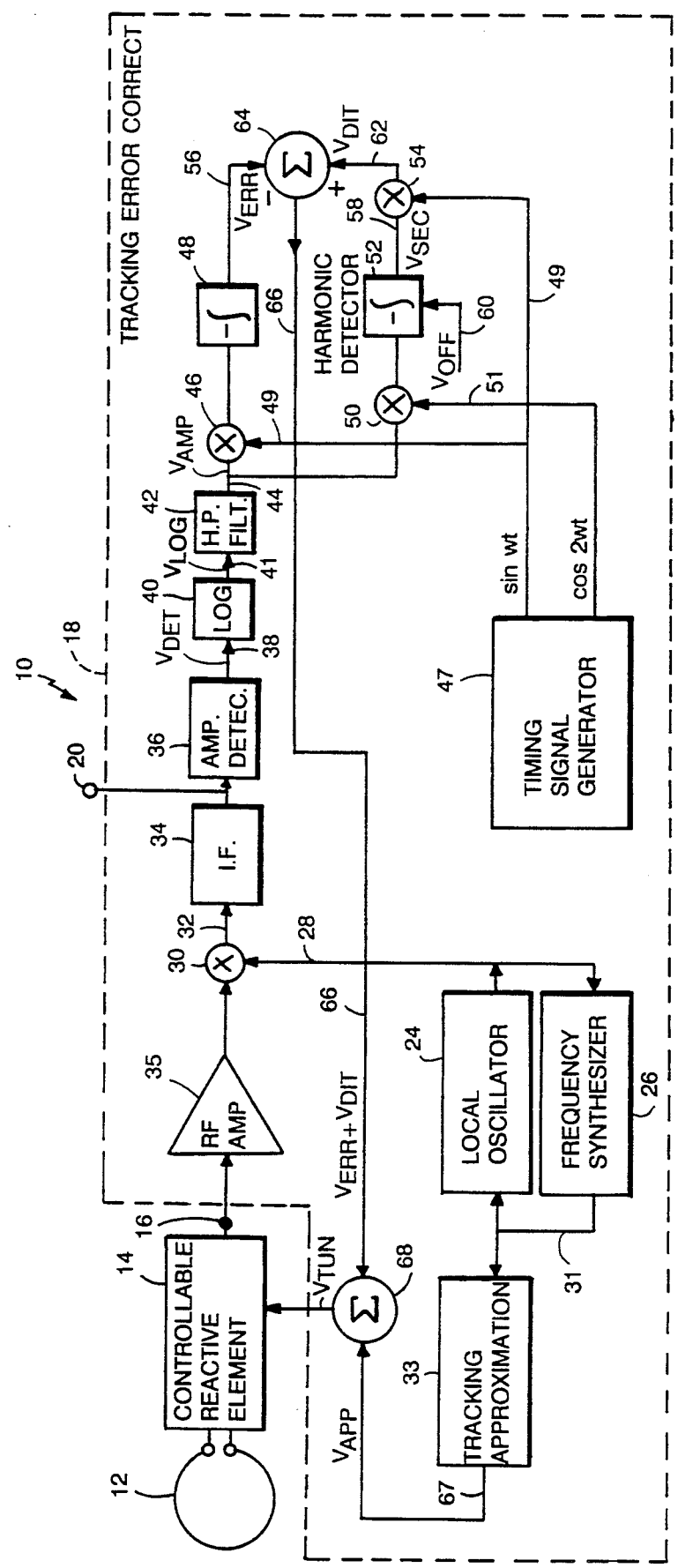
FIG. 1 is a block diagram illustrating the logical arrangement of a system according to the invention.

Referring to FIG. 1, there is shown a block diagram of a radio system 10 embodying the invention. An antenna 12 may be a loop, as shown, a rod and ground plane (monopole), a dipole, a slot, or any other small antenna configuration. Antenna 12 is connected to a controllable reactive element 14, such as a varactor, which resonates with the reactive part of the antenna impedance, which is typically inductive for loop antennas. Antenna 12 is coupled through reactive element 14 to an antenna input 16 of an antenna using system 18.

Antenna using system 18 has an output terminal 20 and an antenna tuning signal provided on line 22 that controls reactive element 14 to resonate with the reactance of antenna 12 at the frequency of the desired signal transduced by antenna 12.

Antenna using system 18 typically comprises a superheterodyne receiver having a local oscillator 24, tuned by a frequency synthesizer 26, producing a local oscillator signal on line 28. Frequency synthesizer 26 produces a tuning signal on line 31 that is applied to local oscillator 24 and to an antenna tracking approximation circuit 33. Antenna tracking approximation circuit 33 produces a tracking approximation voltage signal $V_{app}$ on line 67 which drives one input of a signal summer 68 whose output is a tuning signal voltage $V_{tun}$ on line 22 which drives controllable reactive element 14 to tune antenna 12. Thus, the $V_{app}$ component of tuning signal voltage $V_{tun}$ causes the antenna tuning to approximately track the receiver tuning, i.e., the tuning of controllable reactive element 14 tracks the tuning of local oscillator 24.

The radio signal received by antenna 12, coupled to antenna using system 18 through controllable reactive element 14 and antenna terminal 16, drives a conventional RF amplifier 35. A mixer 30 combines the output of RF amplifier 35 with the local oscillator signal on line 28 to produce an intermediate frequency signal on line 32, which is amplified by an intermediate frequency amplifier 34. The output of intermediate frequency amplifier 34 is available on output terminal 20 for demodulation and reproduction of the modulating signal.

The output of IF amplifier 34 is also input to an amplitude detector 36, i.e., an envelope detector, which produces an amplitude detected signal voltage $V_{det}$ on line 38 proportional to the absolute value of the amplitude variations of the carrier signal output from IF amplifier 34. The amplitude detected signal voltage on line 38 is applied to a logarithmic compensator circuit 40, whose output signal voltage $V_{log}$ on line 41 represents the amplitude variations of the carrier signal relative to the carrier strength, i.e., the percentage of carrier strength variation. The $V_{log}$ signal on line 41 is passed through a high pass filter 42, having a corner frequency lower than the dither frequency, to remove any DC component in the resulting amplitude detected signal voltage $V_{amp}$ output on line 44.

The amplitude detected signal voltage $V_{amp}$ on line 44 is applied to a tracking error correction circuit having a multiplier 46 and an integrator 48. Multiplier 46 is a multi-phase multiplier, i.e., four quadrant multiplier, which multiplies $V_{amp}$ with a sinusoidal 70 Hz tuning dither signal on line 49, sin$\omega$t, generated by a timing signal generator 47. The output of multiplier 46 drives inverting integrator 48 which responds to the DC voltage level at the output of multiplier 46 to produce an error ramp signal voltage $V_{err}$ on line 56 having a negative slope proportional to the DC voltage output from multiplier 46. $V_{err}$ may be viewed as a changing DC voltage, whose rate of change depends on the DC voltage output from multiplier 46. $V_{err}$ on line 56 drives an inverting input of a signal summer 64 whose output on line 66 is combined with $V_{app}$ to produce $V_{tun}$.

The amplitude detected signal on line 44 is also applied to a second-harmonic detector circuit, having a first multiplier 50, an inverting integrator 52, and a second multiplier 54. Multiplier 50, also a multi-phase multiplier, multiplies the amplitude detected signal voltage $V_{amp}$ on line 44 with the second-harmonic of the tuning dither signal on line 51, cos2$\omega$t, also generated by timing signal generator 47. The output of multiplier 50 is applied to the input of inverting integrator 52 which responds to the DC voltage level at the output of multiplier 50 to produce an output ramp signal voltage $V_{sec}$ on line 58 having a negative slope proportional to the DC voltage level at the output of multiplier 50. $V_{sec}$ may be viewed as a changing DC voltage, whose rate of change depends on the DC voltage output from multiplier 46. An integrator offset voltage $V_{off}$ is applied as a DC bias to another input of the integrator on line 60 and results in an output ramp signal voltage $V_{sec}$ having a positive slope even when the DC voltage level at the output of multiplier 50 is negligible.

Output ramp signal voltage $V_{sec}$ on line 58 is applied to one input of multiplier 54, and the tuning dither signal on line 49, sin$\omega$t, is applied to another input of multiplier 54, which multiplies the signals together to produce a dither signal $V_{dit}$ on line 62 having a dither frequency of $\omega$ and an amplitude proportional to $V_{sec}$.

Dither signal $V_{dit}$ on line 62 drives another input of summer 64 which sums $V_{dit}$ with the error voltage ramp signal $V_{err}$ on line 56 to produce a composite error/dither signal voltage $V_{err}+V_{dit}$ on line 66. The composite error/dither signal voltage $V_{err}+V_{dit}$ on line 66 is applied to an input of summer 68 which sums the error/dither signal with the tracking approximation voltage signal $V_{app}$ on line 67, the output from tracking approximation circuit 33. The output of summer 68 on line 22 is $V_{tun}=V_{err}+V_{dit}+V_{app}$, which adjusts controllable reactive element 14 to tune antenna 12.

Figure 2:
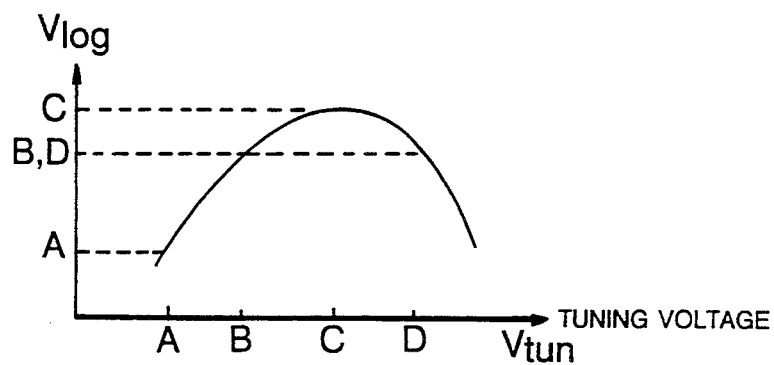
FIG. 2 is a graphical representation of voltage $V_{log}$ as a function of tuning voltage applied to the controllable reactive element.

Having described the system arrangement, its on line 41 versus tuning voltage $V_{tun}$ applied to mode of operation will be explained. Referring to FIG. 2, there is shown a plot of the output signal $V_{log}$ on line 41 versus tuning voltage $V_{tun}$ applied to controllable reactive element 14 on line 22. $V_{tun}=$C represents the tuning voltage required to optimally tune antenna 12 for receiving a desired input signal when $V_{log}$, representative of the relative signal strength of the received carrier, is maximum. As $V_{tun}$ deviates above and below C, the signal strength of the received carrier, represented by $V_{log}$, drops due to detuning of antenna 12. $V_{tun}=$B and D represent detuning below and above C, respectively, and result in the same relative drop in carrier amplitude represented by $V_{log}$. $V_{tun}=$A indicates that greater deviation from $V_{tun}=$C will result in even greater carrier attenuation.

Figure 3A:
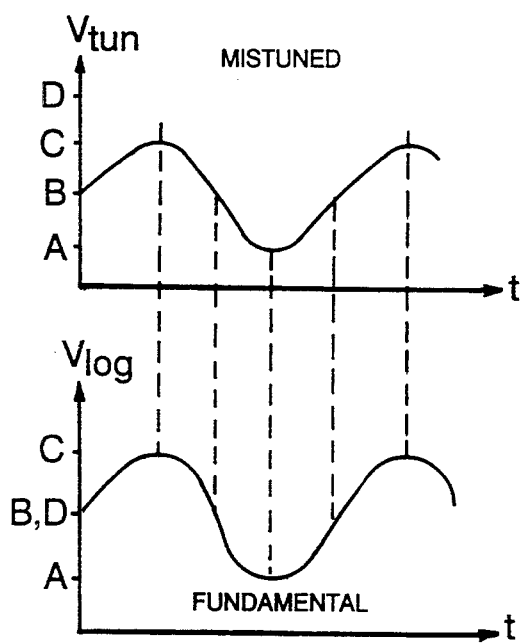
FIG. 3A is a graphical representation of tuning voltage and the resulting voltage $V_{log}$ for a detuned system plotted to a common time scale.

Referring to FIG. 3(a), there are shown graphs of tuning voltage $V_{tun}$ and the resulting relative amplitude signal voltage $V_{log}$ for a detuned system plotted to a common time scale. Here, $V_{tun}$ is sinusoidally dithered with a fundamental frequency $\omega$ about $V_{tun}=$B, from $V_{tun}=$A to $V_{tun}=$C. This system is detuned, since for optimal reception the tuning voltage is $V_{tun}=$C, and any dither should be applied about $V_{tun}=$C voltage rather than about $V_{tun}=$B. As a result, relative amplitude signal voltage $V_{log}$ varies sinusoidally with the same fundamental frequency $\omega$, having maxima corresponding to $V_{log}=$C, minima corresponding to $V_{log}=$A, and zero crossings corresponding to $V_{log}=$B and $V_{log}=$D.

Figure 3B:
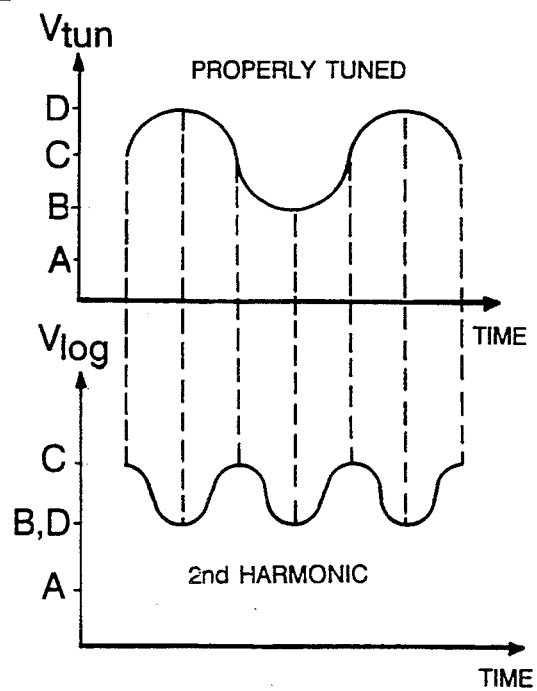
FIG. 3B is a corresponding graphical representation when optimally tuned.

Referring to FIG. 3 (b), there are shown corresponding graphs of tuning voltage $V_{tun}$ and the resulting amplitude detector voltage $V_{log}$ plotted to a common time scale for an optimally tuned system. Here, $V_{tun}$ is sinusoidally dithered, at fundamental frequency $\omega$, about $V_{log}=$C, from $V_{log}=$B to $V_{log}=$D. As a result, $V_{log}$ varies sinusoidally with twice the fundamental dither frequency, i.e., the second harmonic at $2\omega$, having maxima corresponding to $V_{log}=C$, and minima corresponding to $V_{log}=B$ and $V_{log}=D$.

Thus, for an optimally tuned system, a sinusoidal dither signal on $V_{tun}$ will produce a relative amplitude signal voltage $V_{log}$ versus time waveform of frequency which is predominantly the second harmonic of the dither signal. The presence of significant second harmonic energy in the $V_{log}$ waveform indicates that the system is optimally tuned. The amplitude of the dither signal component $V_{dit}$ of tuning voltage $V_{tun}$ may then be reduced. If little or no second harmonic energy is detected, the system is biased to increase the amplitude of the dither signal component $V_{dit}$ of $V_{tun}$ to facilitate capture of the desired signal.

Referring again to FIG. 1, the relative amplitude signal voltage $V_{amp}$ output from high pass filter 42 on line 44 contains energy at the fundamental dither frequency in proportion to the amount of recovered dither present on the received carrier, relative to the overall carrier amplitude. $V_{amp}$ is multiplied with the fundamental dither signal $\sin\omega t$ by multiplier 46, and thus the DC level at the output of multiplier 46 is proportional to the amount of recovered dither present on the received carrier. The DC level at the output of multiplier 46 is integrated by inverting integrator 48. If a relatively small quantity of energy at the fundamental dither frequency $\omega$ is present in $V_{amp}$, then the DC output of the multiplier is relatively small, and the resulting $V_{err}$ ramp has a shallow slope, i.e., the DC level of $V_{err}$ changes very slowly. Conversely, if a relatively large quantity of energy at the fundamental dither frequency $\omega$ is present in $V_{amp}$, then the DC output of the multiplier is relatively large, and the resulting $V_{err}$ ramp has a steeper slope, i.e., the DC level of $V_{err}$ changes rapidly. Since an optimally tuned system has no energy at the fundamental dither frequency $\omega$, $V_{err}$ is fed back to the controllable reactive element 14 as a component of the $V_{tun}$ voltage control signal so as to minimize the energy at the fundamental dither frequency $\omega$, which drives the tuning error to zero.

The relative amplitude signal voltage $V_{amp}$ output from high pass filter 42 on line 44 contains substantial energy at the second harmonic of the dither frequency when the system is optimally tuned. $V_{amp}$ is multiplied with the second harmonic of the signal $\cos 2\omega t$ by multiplier 50, and thus the DC level at the output of multiplier 50 is proportional to the amount of second harmonic energy present on the received carrier. The DC level at the output of multiplier 50 is integrated by inverting integrator 60. If a relatively small quantity of energy at the second harmonic frequency $2\omega$ is present in $V_{amp}$, then the DC output of the multiplier will increase, due to the DC bias on the integrator input, $V_{off}$. Conversely, if a relatively large quantity of energy at the second harmonic of the dither frequency $2\omega$ is present in $V_{amp}$, then the DC output of the multiplier is relatively large, and the resulting $V_{sec}$ will decrease towards zero.

$V_{sec}$ is multiplied with the fundamental dither signal $\sin\omega t$ by multiplier 54 which acts as a variable gain stage to produce the dither component $V_{dit}$ of tuning voltage $V_{tun}$. If the system is detuned, there is little or no energy at the second harmonic $2\omega$ of the dither frequency, and thus little or no resulting DC output from multiplier 50. Thus, the DC level of $V_{sec}$ output from integrator 52 continues to increase due to the DC bias on the integrator input $V_{off}$. The increasing DC level of $V_{sec}$ increases the amplitude of the dither signal $V_{dit}$ output from multiplier 54, and thus increases the amplitude of the dither component of the tuning voltage $V_{tun}$ in an attempt to better tune the system. As the system becomes optimally tuned, the second harmonic $2\omega$ energy increases, in turn increasing the DC output level of multiplier 50. The increasing DC output level of multiplier 50 offsets integrator 52 DC bias $V_{off}$ input so that the DC level of $V_{sec}$ is reduced, which in turn reduces the amplitude of the dither signal $V_{dit}$ output from multiplier 54, and thus decreases the amplitude of the dither component of $V_{tun}$.

The invention has a number of advantages. The invention allows considerable dither during the first few moments of selecting a new station when it is most difficult to find the correct lock-up frequency. Shortly thereafter the invention reduces dither. Thus, the invention avoids the problem of too much dither which might result in audible artifacts and too little dither that might prevent the system from finding the correct lock-up frequency.

In a preferred embodiment, the circuit is capable of determining whether the system is approximately properly locked-up and then decreasing the amount of dither to a low value upon detecting approximately proper lock-up. If the system detects absence of proper lock-up, then it increases the amount of dither to become more certain of acquiring proper lock-up, and decrease the time for locking up.

According to an alternate approach, the system may vary dither in a pre-programmed manner, automatically increasing the dither for a fixed amount of time to insure proper lock-up, and then reducing the dither to maintain lock-up and reduce audible artifacts.

With drift-free components (local oscillator and antenna), the dither may be turned on to tune the antenna after channel change, the tuning voltage may then be stored in drift-free storage, and dither removed.

A preferred embodiment adjusts dither in response to the output of a detector that senses the state of tuning of the antenna. With a sine-wave dither signal it is convenient to sense tuning by detecting the second harmonic of the dither sine wave on the recovered carrier level signal. The presence of a significant amount of second harmonic indicates proper antenna tuning. Alternatively, other dither waveforms may be used. Any dither waveform which has, for example, three states corresponding to nominal tuning, low tuning and high tuning, respectively, may be processed similarly to detect when the antenna is properly tuned. If the recovered carrier amplitude signal is lower at the low tuning and high tuning states than it is at the nominal state, the antenna is approximately tuned correctly.

Certain vehicle radio systems use multiple antennas, typically two, in a diversity system that selects the signal from the antenna then having the better quality signal. This arrangement significantly increases the difficulty of effecting proper antenna tuning. The reason for the additional complication is that the recovered carrier amplitude from one antenna is affected by the tuning of another mutually coupled antenna in the system. If both antennas are tuned simultaneously with the same dither signal, it is difficult to determine how to respond to the change in recovered carrier amplitude.

A preferred embodiment of the invention solves this problem by dithering the respective antenna tuning voltages with sine waves of the same frequency, but in time quadrature. The response of the recovered carrier amplitude signals will be affected by the tuning and dither of the other antenna. However, the relevant information for tuning can be independently extracted for each antenna by multiplying the recovered carrier amplitude signal by a sine wave of the same phase as the tuning voltage dither waveform for that antenna. The interaction from the other antenna is in time quadrature with the multiplying signal. Averaged over any number of full cycles, the interaction term will create no net DC term at the output of the multiplier; therefore, the interaction creates no tuning error and allows properly tuning both antennas.

Alternatively, if the local oscillator, tuning voltage storage means and antennas are sufficiently drift-free, the antennas may be tuned sequentially, just once per channel change in the manner described above for a single antenna, or alternately.

Figure 4:
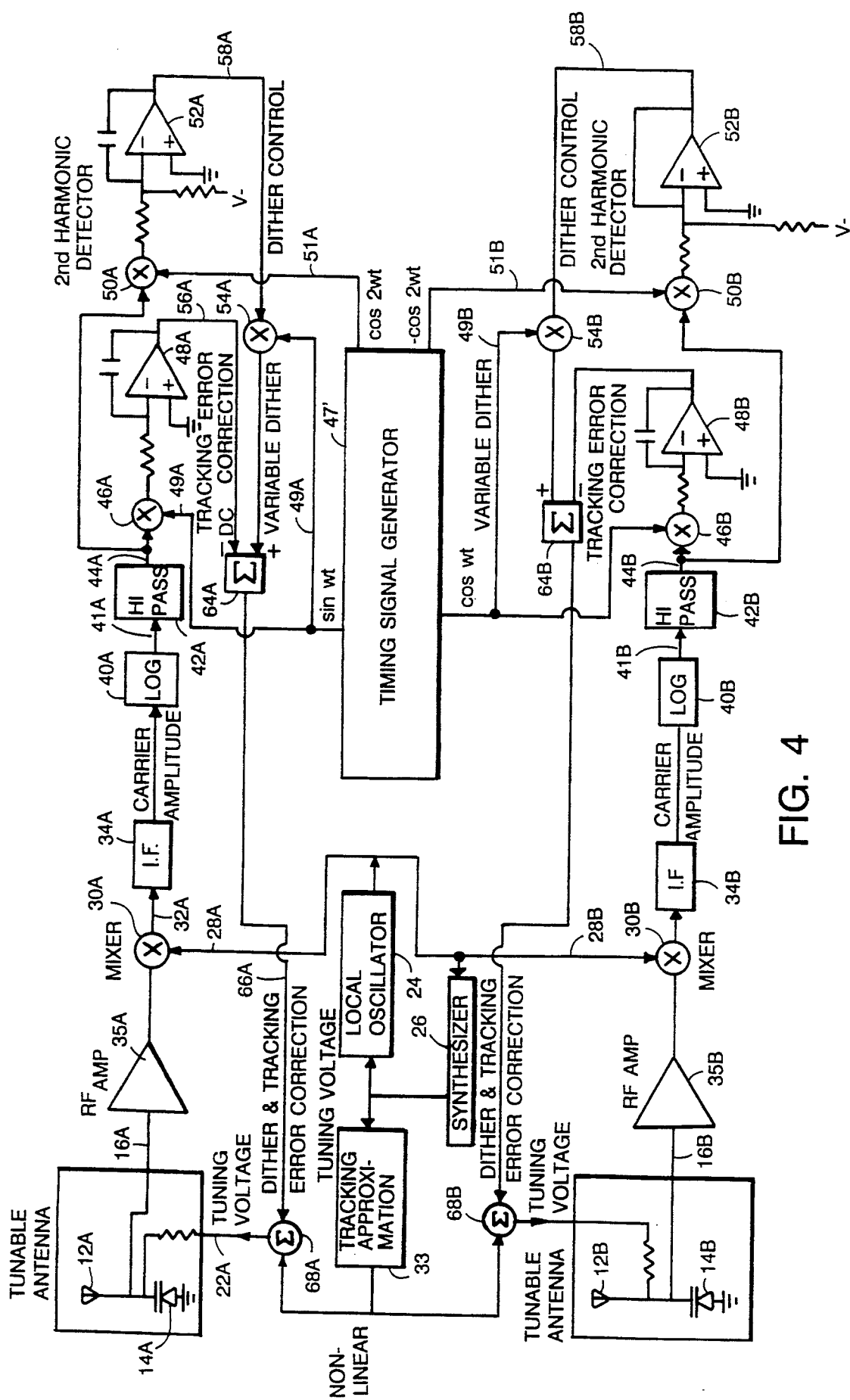
FIG. 4 is a combined block-schematic circuit diagram of an embodiment of the invention for use in a diversity system.

Referring to FIG. 4, there is shown a combined block-schematic circuit diagram of a preferred embodiment of the invention in a diversity system. The same reference numerals identify corresponding elements of FIG. 1, with the addition of an appended letter A to identify elements in the upper channel and the letter B to identify elements in the lower channel. Since these systems have been described above in connection with FIG. 1, the description of FIG. 4 will be limited to a brief description of the features unique to a diversity system. The two channels share a common local oscillator 24, synthesizer 26 and tracking approximation circuit 33 and timing signal generator 47'. Timing signal generator 47' differs from timing signal generator 47 in providing four output signals instead of two. Signals of fundamental frequency $\omega$ in time quadrature energize the A and B channels, respectively. Signals of second harmonic frequency $2\omega$ in phase opposition energize multipliers 50A and 50B.

Referring to FIGS. 5A–5D, there are shown graphical representations of tuning and response waveforms in an alternative embodiment of the invention using tuning dither waveforms with a finite number of discrete states; for example, 3 states.

Figure 5:
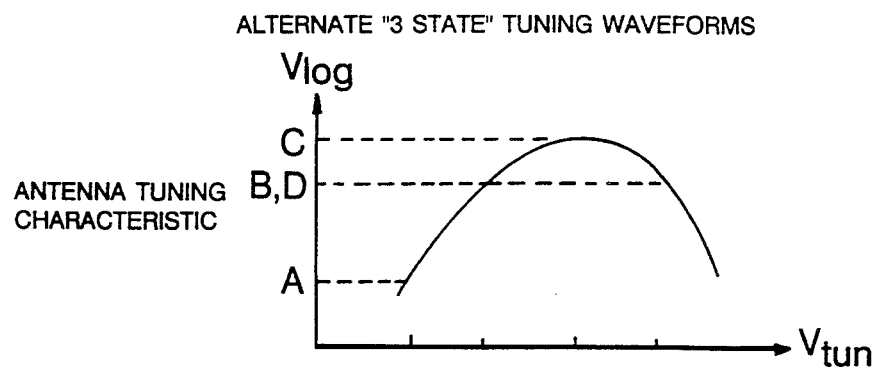
FIGS. 5 and 5A–5D are graphical representations of alternate three-state tuning waveforms.
Figure 5A:
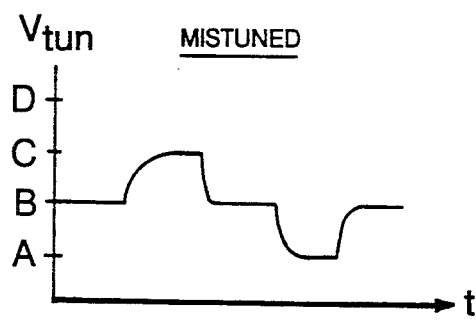
Figure 5B:
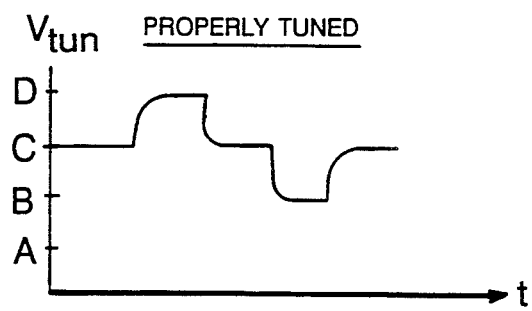
Figure 5C:
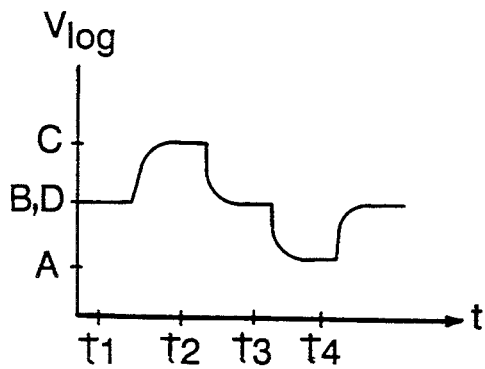
Figure 5D:
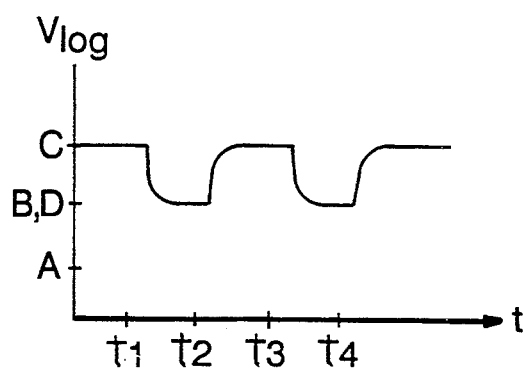
Figure 6:
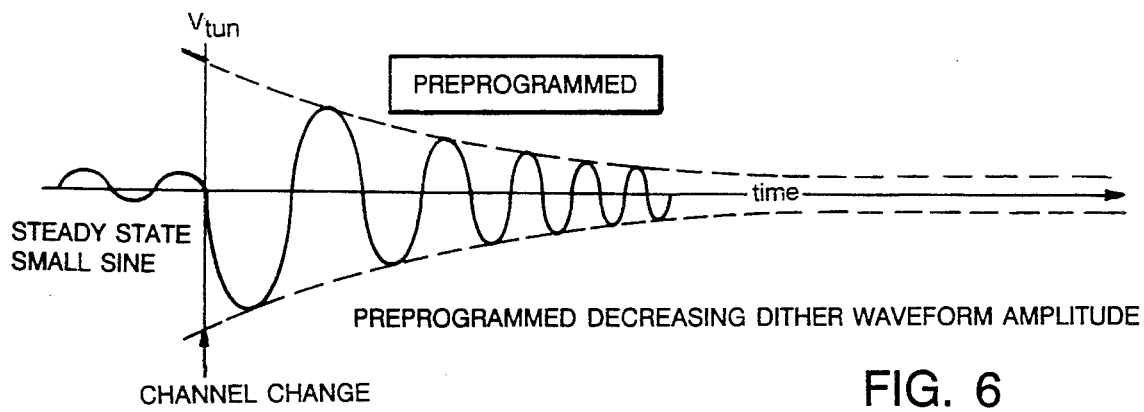
FIG. 6 is a graphical representation of dither waverform types.

It may be easier to implement such a waveform than to implement a sine wave; for example, with digital circuitry. The apparatus for determining whether to tune higher or lower and whether the antenna is properly tuned is substantially the same as shown in FIGS. 1 and 4 except for minor changes in the timing signal generator. FIG. 5A shows unbalance below level C when mistuned. FIG. 5B shows proper tuning symmetrical about level C. FIG. 5C shows unbalance below level C on a logarithmic scale when mistuned. FIG. 5D shows properly tuned with the waveform level shifting between level C and levels B, D on a logarithmic scale.

Alternatively, either analog or digital circuitry may implement the following algorithms:

Main Tuning Algorithm:

If $V_{log}(T_2) > V_{log}(T_4)$, increase the tuning voltage.

If $V_{log}(t_2) = V_{log}(t_4)$, don't change the tuning voltage.

If $V_{log}(t_2) < V_{log}(t_4)$, decrease the tuning voltage.

Dither Control Algorithm:

If $V_{log}(t_1) + V_{log}(t_3) >> V_{log}(t_2) + V_{log}(t_4)$, decrease dither amplitude.

If $V_{log}(t_1) + V_{log}(t_3) \not> V_{log}(t_2) + V_{log}(t_4)$, increase dither amplitude.

It may be advantageous to use in the control algorithms a weighted average of $V_{log}(t_1 \ldots t_4)$ taken in several successive samples.

Figure 7A:
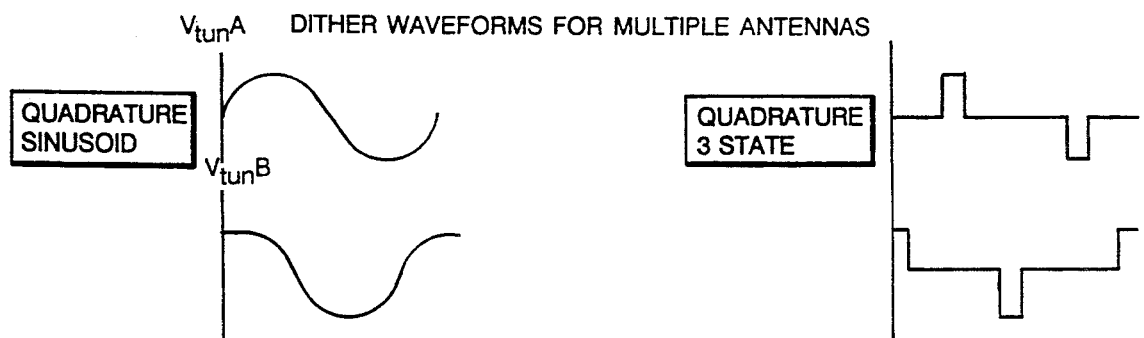
FIGS. 7A–7C are graphical representations of dither waveforms for multiple antennas.
Figure 7B:
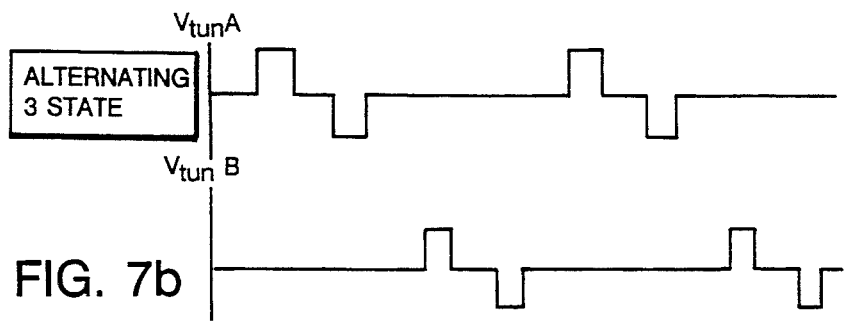
Figure 7C:
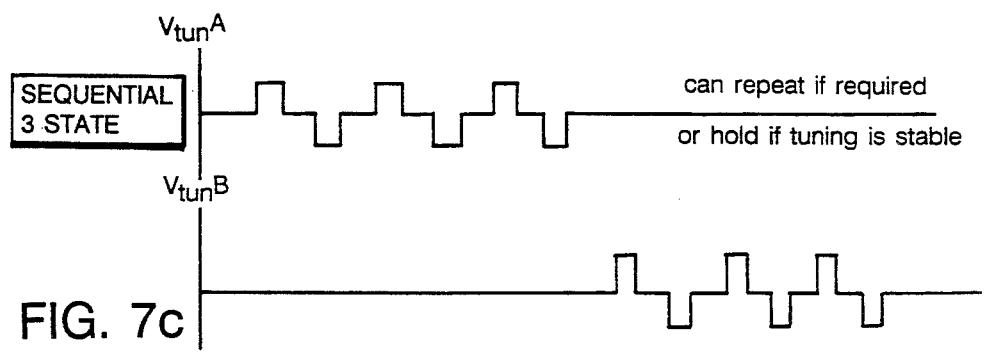

Such three-state waveforms may be appropriately modified to tune two antennas in quadrature. FIG. 7A shows a comparison of quadrature sinusoids with quadrature three-state for the different tuning voltages. FIG. 7B shows alternating three-state tuning voltages. FIG. 7C shows sequential three-state tuning voltages.

Other embodiments are within the following claims.

What is claimed is:

1. A tunable antenna system for operation over a predetermined frequency range comprising, an antenna having a length and width each significantly less than a quarter wavelength within said predetermined frequency range, a controllable reactive element coupled to said antenna having a variable reactance for tuning said antenna in a resonant circuit to the frequency of a desired signal in said frequency range, and an antenna-tuning circuit responsive to the frequency to which said antenna is tuned for providing an antenna-tuning signal to said controllable reactive element, to control the reactance of the reactive element so that the antenna remains tuned to the frequency of said desired signal, said antenna-tuning signal comprising:

a frequency approximation component for roughly tuning said antenna to the frequency of the desired signal, an error component for fine tuning said antenna to the frequency of the desired signal, and a dither component for varying at dither frequency the tuning of said antenna around the frequency of said desired signal.

2. The tunable antenna system of claim 1 wherein the antenna tuning circuit comprises, a detector for producing a level signal including a component at said dither frequency and a component at twice said dither frequency representative of a signal transduced by said antenna, a generator for producing a dither signal of said dither frequency, a tracking error correction circuit for producing said error component of said antenna-tuning signal in response to the amount of energy present in said level signal of said dither frequency, and a second-harmonic detector for producing said dither component of said antenna-tuning signal in response to the amount of energy of twice said dither frequency present in said level signal.

3. The tunable antenna system of claim 2 wherein said tracking error correction circuit comprises a multiplier for multiplying said level signal with said dither signal to produce a product signal having a DC level, and an integrator for integrating the DC level of said product signal to produce said error component of said antenna-tuning signal.

4. The tunable antenna system of claim 2 wherein said detector is an envelope detector for producing said level signal representative of the envelope of a carrier signal transduced by said antenna.

5. The tunable antenna system of claim 2 wherein said generator further provides a reference signal of twice said dither frequency, said second-harmonic detector comprises a first multiplier for multiplying said level signal with said reference signal to produce a product signal having a DC level, and an integrator for integrating the DC level of said product signal to produce an integrated product signal, and a second multiplier for multiplying said integrated product signal with said dither signal to produce said dither component of said antenna-tuning signal.

6. The tunable antenna system of claim 2 and further comprising a superheterodyne receiver circuit having a local oscillator of controllable frequency, a frequency synthesizer for controlling said controllable frequency, and a tracking approximation circuit for producing said frequency approximation component of said tuning signal responsive to said frequency synthesizer.

7. The tunable antenna system of claim 1 wherein the controllable reactive element is a varactor.

8. The tunable antenna system of claim 1 further comprising an antenna using system having a tuner for tuning the antenna using system over a frequency range substantially greater than the bandwidth of a desired signal transduced by the antenna.

9. The tunable antenna system of claim 8 wherein the antenna and the reactive element comprise a circuit having a Q greater than 100.

10. A tunable antenna system in accordance with claim 1 wherein said dither component is characterized by a waveform having states characteristic of nominal tuning, high tuning and low tuning.

11. A tunable antenna system in accordance with claim 1 wherein said dither component is characterized by a three-state waveform.

12. A tunable antenna system in accordance with claim 1 wherein said dither component is characterized by a waveform of progressively decreasing amplitude.

13. A tunable antenna system for operation over a predetermined frequency range comprising, an antenna having a length and width each significantly less than a quarter wavelength within said predetermined frequency range, a controllable reactive element coupled to said antenna having a variable reactance for tuning said antenna in a resonant circuit to the frequency of a desired signal in said frequency range, and an antenna-tuning circuit responsive to the frequency to which said antenna is tuned for providing an antenna-tuning signal to said controllable reactive element, to control the reactance of the reactive element so that the antenna remains tuned to the frequency of said desired signal, said antenna-tuning signal comprising, a dither component of dither frequency for varying the tuning of said antenna around the frequency of said desired signal, said antenna tuning circuit including a level detector for producing a level signal representative of a signal transduced by said antenna, said level signal including a deviation signal representative of the difference between the frequency to which said antenna is then tuned and said desired frequency, and a deviation detector responsive to said deviation signal for providing a dither amplitude control signal that reduces the amplitude of said dither component with decreasing value of said difference.

14. (amended) A tunable antenna system in accordance with claim 13 wherein said deviation signal is a second harmonic signal of frequency twice said dither frequency, and said deviation detector is responsive to said second harmonic signal for providing said dither amplitude control signal that reduces the amplitude of said dither component with increasing amplitude of said second harmonic signal.

15. A tunable antenna system in accordance with claim 13 and further comprising, a second of said antennas, a second of said controllable reactive elements coupled to said second antenna having a variable reactance for tuning said second antenna in a second resonant circuit to the frequency of said desired signal, and a second antenna-tuning circuit responsive to the frequency to which said second antenna is tuned for providing a second antenna-tuning signal to said second controllable reactive element to control the reactance of said second reactive element so that said second antenna remains tuned to the frequency of said desired signal, said second antenna-tuning signal comprising, a second dither component of said dither frequency for varying the tuning of said second antenna around the frequency of said desired signal, said second antenna-tuning circuit including a second level detector for producing a second level signal representative of a signal transduced by said second antenna, said second level signal including a second deviation signal representative of a second difference between the frequency to which said second antenna is then tuned and said desired frequency, and a second deviation detector responsive to said deviation signal for providing a second dither amplitude control signal that reduces the amplitude of said dither signal with decreasing value of said second difference.

16. A tunable antenna system in accordance with claim 15 wherein each of said deviation signals is a second harmonic signal of frequency twice said dither frequency, and each of said first-mentioned and second deviation detectors is responsive to said first-mentioned and second deviation signals respectively for providing said first-mentioned and second dither amplitude control signals that reduce the amplitudes of said first-mentioned and second dither signals respectively with decreasing values of said first-mentioned and second differences respectively.

17. A tunable antenna system in accordance with claim 15 wherein said first-mentioned antenna-tuning circuit and said second antenna-tuning circuit are alternately operative to alternately tune said first-mentioned and said second antennas to said desired frequency.

18. A tunable antenna system in accordance with claim 15 wherein upon a change in said desired frequency said first-mentioned antenna-tuning circuit is operative to tune said first-mentioned antenna to the changed desired frequency and then said second antenna-tuning circuit is operative to tune said second antenna to the changed desired frequency.

19. A tunable antenna system for operation over a predetermined frequency range comprising, first and second antennas each having a length and width each significantly less than a quarter wavelength within said predetermined frequency range with mutual coupling therebetween, first and second controllable reactive elements coupled to said first and second antennas respectively each having a variable reactance for tuning said first and second antennas respectively in first and second resonant circuits respectively to the frequency of a desired signal in said frequency range, first and second antenna-tuning circuits responsive to the frequency to which the associated one of said first and second antennas is tuned for providing first and second antenna-tuning signals to said first and second controllable reactive elements respectively to control the reactance of said first and second reactive elements respectively so that said first and second antennas remain tuned to the frequency of said desired signal, said first and second antenna-tuning circuits including first and second level detectors respectively for providing first and second level signals respectively representative of signals transduced by said first and second antennas respectively, said first and second level signals including first and second deviation signals representative of the difference between said desired frequency and the frequencies to which said first and second antennas are then tuned respectively, and circuit structure for using said first and second deviation signals to independently control said first and second antenna-tuning signals respectively.

20. A tunable antenna system in accordance with claim 19 wherein said first and second antenna-tuning signals include first and second dither components in time quadrature of dither frequency respectively for varying the tuning of said first and second antennas respectively around the frequency of said desired signal.

21. A tunable antenna system in accordance with claim 19 and further comprising control circuitry for sequentially delivering said first and second antenna-tuning signals to said first and second controllable reactive elements respectively.

* * * * *

UNITED STATES PATENT AND TRADEMARK OFFICE
CERTIFICATE OF CORRECTION

PATENT NO. : 5,349,700

DATED : September 20, 1994

INVENTOR(S) : Robert P. Parker

It is certified that error appears in the above-identified patent and that said Letters Patent is hereby corrected as shown below:

Column 4, lines 31-32, "on line 41 versus tuning voltage $V_{tun}$ applied to" should be deleted.

Signed and Sealed this

Eighth Day of October, 1996

*Attest:*

BRUCE LEHMAN

*Attesting Officer*     Commissioner of Patents and Trademarks